(12) United States Patent
Yamamoto

(10) Patent No.: US 9,837,424 B2
(45) Date of Patent: Dec. 5, 2017

(54) SEMICONDUCTOR DEVICE WITH ANTI-FUSE MEMORY ELEMENT

(71) Applicant: Renesas Electronics Corporation, Koutou-ku, Tokyo (JP)

(72) Inventor: Yoshiki Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/874,405

(22) Filed: Oct. 3, 2015

(65) Prior Publication Data
US 2016/0099251 A1    Apr. 7, 2016

(30) Foreign Application Priority Data

Oct. 3, 2014   (JP) ................................. 2014-204596

(51) Int. Cl.
*H01L 21/84* (2006.01)
*H01L 27/112* (2006.01)
*H01L 23/525* (2006.01)

(52) U.S. Cl.
CPC ........ *H01L 27/11206* (2013.01); *H01L 21/84* (2013.01); *H01L 23/5252* (2013.01); *H01L 2924/0002* (2013.01)

(58) Field of Classification Search
CPC ... H01L 27/11206; H01L 21/84; H01L 21/86; H01L 27/1203; H01L 27/1255; H01L 23/5252; H01L 2924/00; H01L 29/66795
See application file for complete search history.

(56) References Cited

U.S. PATENT DOCUMENTS

| 6,200,866 | B1 * | 3/2001 | Ma | H01L 21/28194 257/E21.201 |
| 2003/0063518 | A1 | 4/2003 | Fong et al. | |
| 2003/0071296 | A1 | 4/2003 | Peng | |
| 2007/0114596 | A1 * | 5/2007 | Candelier | H01L 27/0207 257/324 |
| 2008/0116503 | A1 * | 5/2008 | Tsurumi | H01L 21/28273 257/316 |
| 2009/0134468 | A1 * | 5/2009 | Tsuchiya | H01L 21/84 257/368 |
| 2010/0078728 | A1 * | 4/2010 | Li | H01L 21/823425 257/369 |
| 2012/0267752 | A1 * | 10/2012 | Erickson | H01L 21/2652 257/510 |
| 2013/0020626 | A1 * | 1/2013 | Tan | H01L 27/11521 257/316 |
| 2015/0102348 | A1 * | 4/2015 | Cai et al. | H01L 29/785 257/69 |

(Continued)

FOREIGN PATENT DOCUMENTS

JP    2005-504434 A    2/2005
JP    2005-515624 A    5/2005

*Primary Examiner* — Marcos D Pizarro
*Assistant Examiner* — Shannon Yi
(74) *Attorney, Agent, or Firm* — Shapiro, Gabor and Rosenberger, PLLC

(57) ABSTRACT

An insulating film, which is sandwiched between a gate electrode formed on an SOI layer constituting an SOI substrate and an epitaxial layer formed on the SOI layer and including a high-concentration diffusion region and is formed in contact with a side wall of the gate electrode, is set as a target of dielectric breakdown in a write operation in an anti-fuse element.

17 Claims, 6 Drawing Sheets

(56) References Cited

U.S. PATENT DOCUMENTS

| | | | | |
|---|---|---|---|---|
| 2015/0228777 A1* | 8/2015 | Zhang | ................... | H01L 29/78 257/347 |
| 2016/0094217 A1* | 3/2016 | Garg et al. | ........... | H03K 17/687 327/108 |
| 2016/0351498 A1* | 12/2016 | Chang | ................ | H01L 23/5252 |

* cited by examiner

FIG. 6

| | GATE ELECTRODE GM | DIFFUSION REGION D1 | GATE ELECTRODE G1 | DIFFUSION REGION D2 | GATE ELECTRODE G2 | DIFFUSION REGION D3 |
|---|---|---|---|---|---|---|
| ONE-STAGE SELECTION Tr STRUCTURE (BEFORE BREAKDOWN) | 4.5V | 0.0V | 2.0V | 0.0V | – | – |
| ONE-STAGE SELECTION Tr STRUCTURE (RIGHT AFTER BREAKDOWN) | 4.5V | 4.5V | 2.0V | 0.0V | – | – |
| TWO-STAGE SELECTION Tr STRUCTURE (BEFORE BREAKDOWN) | 4.5V | 0.0V | 3.0V | 0.0V | 0.8V | 0.0V |
| TWO-STAGE SELECTION Tr STRUCTURE (RIGHT AFTER BREAKDOWN) | 4.5V | 4.5V | 3.0V | 2.2V | 0.8V | 0.0V |

SEMICONDUCTOR DEVICE WITH ANTI-FUSE MEMORY ELEMENT

CROSS-REFERENCE TO RELATED APPLICATION

The present application claims priority from Japanese Patent Application No. 2014-209596 filed on Oct. 3, 2014, the content of which is hereby incorporated by reference into this application.

TECHNICAL FIELD OF THE INVENTION

The present invention relates to a semiconductor device, and particularly relates to a technique effectively applied to a semiconductor device having a silicon on insulator (SOI) substrate.

BACKGROUND OF THE INVENTION

Currently, semiconductor devices using an SOI substrate have been used as a semiconductor device capable of suppressing short-channel characteristics and variations in elements. In the SOI substrate, a buried oxide (BOX) film is formed on a supporting substrate made of high-resistance silicon (Si) and a thin layer mainly containing silicon (Si) (silicon layer or SOI layer) is formed on the BOX film.

In the case where a metal oxide semiconductor field effect transistor (MOSFET) is formed on the SOI substrate, it is possible to suppress the short-channel characteristics without introducing an impurity into a channel layer. As a result, the mobility can be improved and it is possible to suppress the variations in element due to impurity fluctuation. Thus, the improvement in integration density and operating speed in the semiconductor device and the improvement in operating margin owing to the reduction of the variations can be expected by manufacturing the semiconductor device using the SOI substrate.

Japanese Patent Application Laid-Open Publication No. 2005-504434 (Patent Document 1) describes a technique of storing information by causing breakdown of an ultra-thin dielectric between a bulk silicon substrate and a gate electrode on the bulk silicon substrate. In addition, Japanese Patent Application Laid-Open Publication No. 2005-515624 (Patent Document 2) describes a technique of forming a capacitor structure by providing an $n^+$ region in a bulk silicon substrate below a gate electrode.

SUMMARY OF THE INVENTION

As described in the Patent Document 1, in an anti-fuse element (memory element) in which a gate electrode is formed on a semiconductor substrate via an insulating film and writing of information is performed by causing dielectric breakdown of the insulating film, there is a problem that an electric field is hardly applied to the gate electrode in the case where a channel in the semiconductor substrate is depleted. In order to prevent such depletion, the provision of the capacitor structure is considered as described in the Patent Document 2.

However, when the anti-fuse element is provided on the SOI substrate, it is difficult to form a high-concentration impurity diffusion region on an upper surface of the SOI substrate in order to form the capacitor structure as described above.

In addition, a high voltage is applied to the selection transistor adjacent to the gate electrode in the write operation. Since the transistor on the SOI substrate has a relatively low drain withstand voltage, there is a risk of deterioration in the characteristics of the selection transistor if the anti-fuse element described in the Patent Document 1 and the Patent Document 2 is directly applied to the SOI element.

The other objects and novel characteristics of the present invention will be apparent from the description of the present specification and the accompanying drawings.

The following is a brief description of an outline of the typical embodiment of the invention disclosed in the present application.

In the semiconductor device according to an embodiment, an insulating film, which is sandwiched between a gate electrode formed on an SOI substrate and an epitaxial layer including a high-concentration diffusion region and is formed in contact with a side wall of the gate electrode, is set as a target of dielectric breakdown in a write operation in an anti-fuse element.

According to an embodiment disclosed in this application, it is possible to improve the performance of a semiconductor device. In particular, it is possible to realize the power saving of a semiconductor element in a semiconductor device having an anti-fuse element.

BRIEF DESCRIPTIONS OF THE DRAWINGS

FIG. 6 is a table describing each operation of a semiconductor device of a comparative example and the semiconductor device of the second embodiment.

DESCRIPTIONS OF THE PREFERRED EMBODIMENTS

Figure 1:
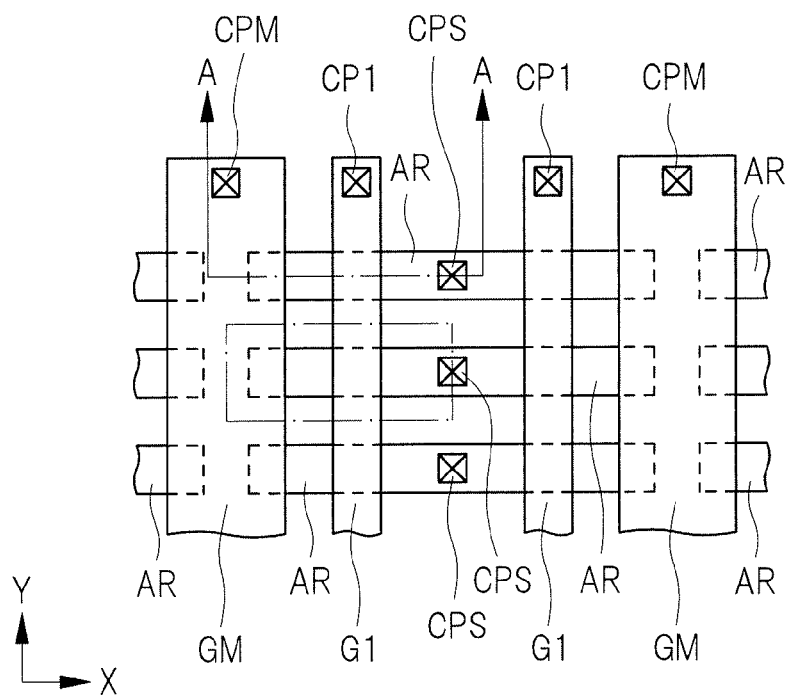
FIG. 1 is a planer layout illustrating a semiconductor device of the first embodiment of the present invention.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, in the embodiments described below, the description of the same or similar portions is not repeated in principle unless particularly required in the following embodiments.

In addition, in this application, a substrate which includes a semiconductor substrate and a BOX film and a semiconductor layer sequentially stacked on the semiconductor substrate is referred to as an SOI substrate. Also, the semiconductor layer on the BOX film is referred to as an SOI layer in some cases. Further, a semiconductor element provided on the SOI substrate is referred to as an SOI element in some cases. Furthermore, in the case where a semiconductor element is provided on a thick semiconductor substrate made of silicon without a BOX film and an SOI layer interposed therebetween, the semiconductor substrate is referred to as a bulk silicon substrate. Moreover, a memory transistor and a selection transistor serving as anti-fuse elements are collectively referred to as a memory cell or a unit memory cell in some cases.

(First Embodiment)

In this embodiment, the case in which the anti-fuse element serving as a memory element is formed on the SOI substrate and an insulating film which covers a side wall of a gate electrode is set as a target of dielectric breakdown to be performed for a write operation will be described.

Figure 2:
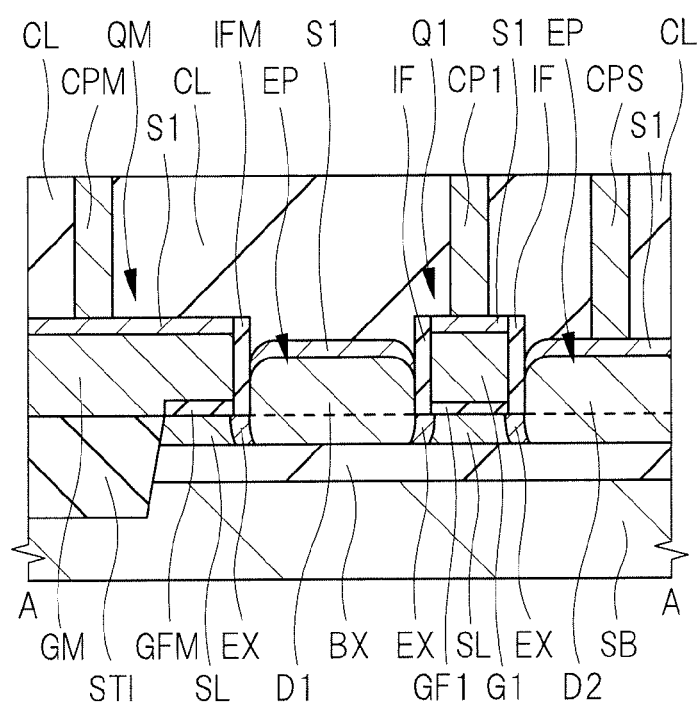
FIG. 2 is a cross-sectional view taken along a line A-A of FIG. 1.

Hereinafter, a structure of the memory element and the selection transistor on the SOI substrate in this embodiment will be described with reference to FIGS. 1 and 2. FIG. 1 is a planer layout illustrating a memory array constituting a semiconductor device of this embodiment. FIG. 2 is a cross-sectional view taken along a line A-A of FIG. 1. FIG. 1 illustrates only an active region AR, gate electrodes G1 and GM, contact plugs CP1, CPM and CPS, and illustrations of an element isolation region, an offset spacer, a silicide layer, an interlayer insulating film, a wiring and the like are omitted. In addition, in FIG. 1, an outline of the active region AR right below each of the gate electrodes G1 and GM is illustrated by the dashed line.

As illustrated in FIG. 1, the semiconductor device according to the first embodiment has the SOI substrate, and the semiconductor layer (SOI layer) serving as an upper layer in the SOI substrate constitutes the active region AR. A layout of the active region AR is defined by the element isolation region (not illustrated) surrounding a periphery thereof. Namely, the active region AR is a region which does not overlap the element isolation region in a plan view. A plurality of the active regions AR are disposed side by side in a Y direction along a main surface of the SOI substrate. Each of the plurality of active regions AR extends in an X direction, which is a direction along the main surface of the SOI substrate and is perpendicular to the Y direction. In addition, the plurality of active regions AR are disposed side by side in the X direction. Namely, the plurality of active regions AR extending in the X direction are disposed in a matrix form in the X direction and the Y direction. The neighboring active regions AR are separated from each other by the element isolation region interposed therebetween.

The gate electrode G1 and the gate electrode GM are formed so as to lie astride the plurality of active regions AR arranged in the Y direction. Each of the gate electrode G1 and the gate electrode GM extends in the Y direction and is disposed side by side in the X direction. Namely, the X direction is a gate length direction of each of the gate electrode G1 and the gate electrode GM, and the Y direction is a gate width direction of each of the gate electrode G1 and the gate electrode GM.

The gate electrodes GM are formed respectively right above end portions of one active region AR on both sides in the X direction via a gate insulating film GFM (see FIG. 2). Namely, when seen in a plan view, the gate electrode GM overlaps the end portion of the active region AR in the X direction. Two gate electrodes G1, which overlap the active region AR when seen in a plan view, are formed between the two gate electrodes GM which overlap the both ends of the corresponding active region AR in the X direction. Specifically, the gate electrode GM, the gate electrode G1, the gate electrode G1 and the gate electrode GM are sequentially disposed side by side in this order in the X direction right above the active region AR. One gate electrode GM overlaps the plurality of active regions AR arranged in the Y direction when seen in a plan view, and one gate electrode G1 overlaps the plurality of active regions AR arranged in the Y direction when seen in a plan view.

In addition, one gate electrode GM overlaps each end portion of the active regions AR neighboring each other in the X direction when seen in a plan view. Namely, the active regions AR neighboring each other in the X direction are separated via an element isolation region (not illustrated) right below the gate electrode GM.

The gate electrode G1 and source and drain regions in the active region AR adjacent to the gate electrode G1 constitute the selection transistor. In addition, the gate electrode GM and one active region AR adjacent to the gate electrode GM constitute the memory transistor. Specifically, the gate electrode G1 is a selection gate electrode, and the gate electrode GM is a memory gate electrode. However, the memory transistor is a half transistor which does not have a drain region, but has a source region.

The contact plug CPS is connected to one active region AR only in a region sandwiched between the two gate electrodes G1 right above the corresponding active region AR, and the contact plug is not connected to the corresponding active region AR in the other region. The active region AR at a position to which the contact plug CPS is connected constitutes the source region of the selection transistor. The contact plug CP1 is connected to the gate electrode G1, and the contact plug CPM is connected to the gate electrode GM.

In FIG. 1, a region of the unit memory cell in which one-bit information is stored is enclosed by a one-dot chain line. The unit memory cell has one memory transistor and one selection transistor. In a memory cell array in which a plurality of the unit memory cells are arranged, the plurality of unit memory cells are repeatedly disposed in a matrix form. Namely, the plurality of unit memory cells are repeatedly disposed side by side in the Y direction. In addition, the plurality of unit memory cells are repeatedly disposed side by side in the X direction. However, the unit memory cells neighboring in the X direction have a line-symmetric layout with respect to a boundary line therebetween. Two unit memory cells are formed in one active region.

In this manner, the source regions of a plurality of the selection transistors which constitute the plurality of memory cells arranged in the Y direction are formed so as to be separated from each other, and the plurality of source regions are not electrically connected to each other.

As illustrated in FIG. 2, the SOI substrate constituting the semiconductor device of the first embodiment has a semiconductor substrate SB, a BOX film BX on the semiconductor substrate SB, and an SOI layer SL which is a semiconductor layer on the BOX film BX. The semiconductor substrate SB serving as a supporting substrate is a monocrystalline silicon substrate having a high resistance of, for example, 750 Ωcm or higher, and has a thickness of, for example, about 500 μm to 700 μm. The BOX film BX is made of, for example, a silicon oxide film and a film thickness thereof is 5 to 100 nm. Here, the film thickness of the BOX film BX is, for example, 50 nm. The SOI layer SL is a semiconductor layer made of monocrystalline silicon, and a film thickness thereof is 3 to 15 nm. Here, the film thickness of the SOI layer SL is, for example, 15 nm.

Incidentally, FIG. 2 illustrates the contact plugs CP1 and CPM, which does not overlap the line A-A of FIG. 1, in addition to the contact plug CPS in order to facilitate understanding of the structure of the semiconductor device of this embodiment.

A selection transistor Q1 and a memory transistor QM are formed side by side on the SOI substrate. A trench is formed on an upper surface of the SOI substrate below the memory transistor QM, and an element isolation region STI that electrically separates the unit memory cells is formed in the trench. A bottom surface of the element isolation region STI reaches an intermediated depth of the semiconductor substrate SB. Namely, the element isolation region STI penetrates through the SOI layer SL and the BOX film BX. One selection transistor Q1 and one memory transistor QM constitute the unit memory cell in which one-bit information is stored.

Here, each of the selection transistor Q1 and the memory transistor QM is described as an n-channel MOSFET, but each of these transistors may be a p-channel MOSFET. In the p-channel MOSFET, the source and drain regions are constituted of a p-type semiconductor region unlike the n-channel MOSFET.

The selection transistor Q1 has the gate electrode G1 formed on the SOI layer SL via a gate insulating film GF1. The gate insulating film GF1 is made of, for example, a silicon oxide ($SiO_2$) film. The gate electrode G1 is made of, for example, an n-type semiconductor film mainly containing polycrystalline silicon (Si). Namely, the gate electrode G1 is made of a polysilicon film in which an n-type impurity (for example, phosphorus (P) or arsenic (As)) is introduced. A height from an upper surface of the SOI layer SL to an upper surface of the gate electrode G1 in a direction perpendicular to the main surface of the SOI substrate is, for example, 100 nm.

Each of the side walls on both sides of the gate electrode G1 is covered with an insulating film IF serving as an offset spacer. Namely, for example, the insulating film IF is formed before forming an extension region EX to be described later and before forming diffusion regions D1 and D2 to be described later. The insulating film IF is in contact with each side wall of the gate insulating film GF1 and the gate electrode G1, and is made of, for example, a silicon nitride ($Si_3N_4$) film. The element isolation region STI has, for example, a shallow trench isolation (STI) structure and is mainly made of a silicon oxide film. Incidentally, the element isolation region STI may have a local oxidization of silicon (LOCOS) structure instead of the STI structure.

A film thickness of the insulating film IF is 10 nm or smaller. Here, the film thickness of the insulating film IF is, for example, 5 nm. Incidentally, the film thickness of the insulating film IF formed along the side wall of the gate electrode G1 indicates a length of the insulating film IF in a direction perpendicular to the side wall of the gate electrode G1.

Although not illustrated here, a sidewall may be formed on the side wall of the gate electrode G1 via the insulating film IF. The sidewall is an insulating film to be formed in a self-aligned manner next to the gate electrode G1, and is constituted of, for example, a stacked film made up of a silicon oxide film and a silicon nitride film formed thereon. The silicon oxide film is a film having an L-shaped cross section and is formed between the silicon nitride film and the gate electrode G1 and between the silicon nitride film and the SOI layer SL.

A pair of epitaxial layers EP is formed on the SOI layer SL next to the gate electrode G1 so as to sandwich the gate electrode G1 in a direction along the upper surface of the SOI substrate. The epitaxial layer EP is a semiconductor layer (elevation layer) which is deposited by an epitaxial growth method on the SOI layer SL, and a bottom surface of the epitaxial layer EP is integrated with the upper surface of the SOI layer SL. In FIG. 2, a boundary between the epitaxial layer EP and the SOI layer SL is illustrated by the dashed line.

A height of an upper surface of the epitaxial layer EP is higher than a bottom surface of the gate electrode G1, and the epitaxial layer EP is in contact with a side wall of the insulating film IF in contact with the side wall of the gate electrode G1. A distance from the upper surface of the SOI layer SL to the upper surface of the epitaxial layer EP in a direction perpendicular to the upper surface of the SOI substrate, that is, a height of the epitaxial layer EP is, for example, 20 to 40 nm. In the case where the above-described sidewall is formed, the epitaxial layer EP is formed to be in contact with a side wall of the sidewall.

The SOI layer SL right below the gate electrode G1, that is, a silicon layer is a channel layer including a channel region in which current flows at the time of driving of the selection transistor Q1. A pair of source and drain regions is formed in the SOI layer SL and the epitaxial layer EP next to the gate electrode G1 so as to sandwich the channel region.

The drain region of the selection transistor Q1 has the extension region (low-concentration diffusion region) EX which is an n-type semiconductor region and has a relatively low impurity concentration and the diffusion region (high-concentration diffusion region) D1 which is an n-type semiconductor region and has a higher impurity concentration than the extension region EX. In addition, the source region of the selection transistor Q1 has the extension region (low-concentration diffusion region) EX which is an n-type semiconductor region and has a relatively low impurity concentration and the diffusion region (high-concentration diffusion region) D2 which is an n-type semiconductor region and has a higher impurity concentration than the extension region EX. In this manner, the source and drain regions have the lightly doped drain (LDD) structure including the high-concentration and low-concentration impurity diffusion regions.

Specifically, a pair of the extension regions EX is formed so as to sandwich the channel region when seen in a plan view, and the diffusion region D1 and the diffusion region D2 are formed so as to sandwich the channel region when seen in a plan view.

An n-type impurity (for example, phosphorus (P) or arsenic (As)) is introduced in the extension region EX and the diffusion regions D1 and D2. The extension region EX is formed at a position close to the above-described channel region than the diffusion regions D1 and D2. Namely, the formation position of the extension region EX is closer to the gate electrode G1 than each formation position of the diffusion regions D1 and D2. A concentration of the n-type impurity of each of the diffusion regions D1 and D2 in the epitaxial layer EP and the SOI layer SL is, for example, $1 \times 10^{20}$ to $1 \times 10^{21}/cm^3$.

Almost no n-type or p-type impurity is introduced in the SOI layer SL in a region sandwiched by the opposing extension regions EX right below the gate electrode G1, that is, in the channel region. Namely, the SOI layer SL is an intrinsic semiconductor layer. Even if the p-type impurity is introduced in the SOI layer SL, an impurity concentration thereof is $1 \times 10^{17}/cm^3$ or lower.

Incidentally, in FIG. 2, the extension region EX is formed from the upper surface to the lower surface of the SOI layer SL. Specifically, the selection transistor Q1 illustrated in FIG. 2 is a fully-depleted MOSFET. Meanwhile, a formation depth of the extension region EX may be an intermediate depth of the SOI layer SL. Similarly, in FIG. 2, the diffusion regions D1 and D2 are formed from the upper surface of the epitaxial layer EP to the lower surface of the SOI layer SL, but each formation depth of the diffusion regions D1 and D2 may be the intermediate depth of the SOI layer SL.

A high-concentration n-type impurity is implanted into the epitaxial layer EP formed on the SOI layer SL exposed from the gate insulating film GF1, the gate electrode G1, the insulating film IF and the element isolation region STI, thereby forming the diffusion region D1 or D2. Namely, the diffusion region D1 is formed in one epitaxial layer EP in the pair of epitaxial layers EP sandwiching the gate electrode G1, and the diffusion region D2 is formed in the other epitaxial layer EP. In addition, a silicide layer S1 in contact with the upper surface of the epitaxial layer EP and the silicide layer S1 in contact with the upper surface of the gate electrode G1 are formed. The silicide layer S1 is made of, for example, nickel silicide (NiSi) or cobalt silicide (CoSi).

Specifically, the epitaxial layer EP constitutes the source and drain regions of the selection transistor Q1. The epitaxial layer EP is provided for the purpose of, for example, preventing the entire film thickness of the thin SOI layer SL from being silicided when the silicide layer S1 is formed on each upper surface of the source and drain regions. In addition, the epitaxial layer EP including the diffusion region D1 is used as a current path of the dielectric breakdown occurring at the time of performing the write operation of information using the memory transistor QM as described later.

In addition, the gate electrode GM is formed on the SOI layer SL and the element isolation region STI in a region next to the gate electrode G1 and on the side close to the diffusion region D1. The gate insulating film GFM is formed between the SOI layer SL and the gate electrode GM. Here, the gate insulating film GEM is not formed in the region between the element isolation region STI and the gate electrode GM, but the gate insulating film GFM may be formed in that region. The gate electrode GM and the SOI layer SL are insulated from each other by the gate insulating film GFM interposed therebetween. A film thickness of the gate insulating film GFM is, for example, 2 to 3 nm.

The gate insulating film GFM is made of, for example, a silicon oxide film, and the gate electrode GM is made of, for example, a polysilicon film like the gate electrode G1. The gate electrode GM is formed right above the element isolation region STI and the SOI layer SL adjacent to the element isolation region STI so as to lie astride them. Each of the gate electrode GM and the gate electrode G1 has the same height. Namely, a height from the upper surface of the SOI layer SL to the upper surface of the gate electrode GM in the direction perpendicular to the main surface of the SOI substrate is, for example, 100 nm. A gate length of the gate electrode GM is larger than a gate length of the gate electrode G1. The silicide layer S1 is formed on the gate electrode GM so as to be in contact with the upper surface of the gate electrode GM. The silicide layer S1 is made of, for example, nickel silicide (NiSi) or cobalt silicide (CoSi).

A side wall of the gate electrode GM is covered with an insulating film IFM in contact with the side wall. The insulating film IFM is made of, for example, a silicon nitride ($Si_3N_4$) film. The insulating film IFM is a film which has been formed simultaneously with the insulating film IF in a step of forming the insulating film IF. Specifically, after a silicon nitride film is deposited on the SOI substrate by, for example, a CVD method, a part of the silicon nitride film is removed by using a dry etching method to expose the upper surface of the SOI layer SL, thereby forming the insulating film IFM made of the silicon nitride film in contact with the side walls on both sides of the gate electrode GM.

A film thickness of the insulating film IFM is 10 nm or smaller. Here, for example, the film thickness of the insulating film IFM is 5 nm. Incidentally, the film thickness of the insulating film IFM formed along the side wall of the gate electrode GM indicates a length of the insulating film IFM in a direction perpendicular to the side wall of the gate electrode GM. The sidewall is not formed between the insulating film IFM and the epitaxial layer EP including the diffusion region D1.

The gate electrode GM constitutes the memory transistor QM. The memory transistor QM has the source region including the diffusion region D1 and the extension region EX next to the gate electrode GM, but does not have the drain region. Namely, the memory transistor QM is a half transistor.

The memory transistor QM and the selection transistor Q1 share the diffusion region D1. Specifically, the source region of the memory transistor QM and the drain region of the selection transistor Q1 have the diffusion region D1 formed in the same epitaxial layer EP. The gate electrode GM and the gate electrode G1 are disposed so as to sandwich the epitaxial layer EP including the diffusion region D1. In this manner, the memory transistor QM and the selection transistor Q1 are connected in series.

Since the insulating film IFM is interposed between the epitaxial layer EP and the gate electrode GM, the gate electrode GM and the epitaxial layer EP are insulated from each other. Similarly, since the insulating film IF is interposed between the epitaxial layer EP and the gate electrode G1, the gate electrode G1 and the epitaxial layer EP are insulated from each other.

The epitaxial layer EP and the gate electrode GM are disposed adjacent to each other in a direction along the main surface of the SOI substrate. Namely, the height of the upper surface of the epitaxial layer EP is higher than a height of a bottom surface of the gate electrode GM, and the gate electrode GM and the epitaxial layer EP are formed to have the same height. In addition, one side wall of the insulating film IFM is in contact with the side wall of the gate electrode GM at a predetermined height, and the other side wall thereof is in contact with the epitaxial layer EP at the predetermined height. The height of the upper surface of the epitaxial layer EP is lower than the height of each of the gate electrodes GM and G1.

An interlayer insulating film CL is formed on the SOI substrate so as to cover the selection transistor Q1 and the memory transistor QM. Specifically, each of the gate electrodes GM and G1 and a plurality of the epitaxial layers EP is covered with the interlayer insulating film CL. In addition, a plurality of contact holes are formed so as to penetrate through the interlayer insulating film CL, and the contact plug CPS, CP1 or CPM is buried in each of the plurality of contact holes. The interlayer insulating film CL is made of, for example, a silicon oxide film and an upper surface thereof is planarized at the same height as that of each upper surface of the contact plugs CPS, CP1 and CPM.

Each of the contact plugs CPS, CP1 and CPM is a columnar conductor film and is made up of, for example, a barrier conductor film covering a side wall and a bottom surface inside the contact hole and a main conductor film formed in the contact hole via the barrier conductor film and completely burying the contact hole. The barrier conductor film contains, for example, titanium (Ti) or titanium nitride (TiN), and the main conductor film is made of, for example, tungsten (W). In the illustration of FIG. 2, the barrier conductor film and the main conductor film constituting the contact plugs CPS, CP1 and CPM are not distinguished from each other.

The contact plug CPS is connected to the source region of the selection transistor Q1, that is, the epitaxial layer EP including the diffusion region D2 through the silicide layer S1. The contact plug CP1 is connected to the gate electrode G1 of the selection transistor Q1 through the silicide layer S1. The contact plug CPM is connected to the gate electrode GM of the memory transistor QM through the silicide layer S1. Meanwhile, the contact plug is not connected to the source region of the memory transistor QM, that is, the drain region of the selection transistor Q1.

Although the illustration of a structure on the interlayer insulating film CL is omitted, an interlayer insulating film made of, for example, SiOC is formed on the interlayer insulating film CL and the contact plugs CPS, CP1 and CPM. A plurality of wiring trenches which expose each upper surface of the contact plugs CPS, CP1 and CPM are formed in the interlayer insulating film, and a wiring is formed in each of the wiring trenches. The wiring mainly contains, for example, copper (Cu).

Here, a characteristic of the semiconductor device according to this embodiment is, particularly, that the high-concentration epitaxial layer EP including the source region of the memory transistor QM on the SOI substrate and the gate electrode GM are adjacent to each other via the insulating film IPM in contact with the side wall of the gate electrode GM.

Hereinafter, an operation of the memory element constituting the semiconductor device according to this embodiment will be described.

The memory element is a non-volatile memory element that determines the presence or absence of writing of information depending on the presence or absence of the dielectric breakdown in the insulating film. Namely, the memory transistor QM constitutes an anti-fuse element.

When information is written in the anti-fuse element, a voltage of, for example, 2.0 V is applied to the gate electrode G1 through the contact plug CP1 to set the selection transistor Q1 to be in an on-state. In addition, a voltage of, for example, 4.5 V is applied to the gate electrode GM of the memory transistor QM through the contact plug CPM. Further, a ground potential is applied to the source region of the selection transistor Q1 through the contact plug CPS. In this manner, a potential difference between the gate electrode GM and the source region is increased to cause breakdown of the insulating film IFM in contact with the side wall of the gate electrode GM.

As described above, a resistance value between the gate electrode GM and the epitaxial layer EP including the diffusion region D1 is varied by causing the dielectric breakdown of the insulating film IFM. When reading is performed in the memory cell, a voltage is applied to the gate electrode G1 to set the selection transistor Q1 to be in an on-state, the ground potential is applied to the source region of the selection transistor Q1, and a predetermined potential lower than 4.5 V is applied to the gate electrode GM. At this time, since the resistance value of the insulating film IFM decreases if the above-described dielectric breakdown has occurred, a relatively large current (leakage current) flows between the gate electrode GM and the source region of the memory transistor QM. Thus, it is possible to perform the reading from the memory cell by detecting the current flowing in the memory cell between the contact plug CPM and the contact plug CPS.

Specifically, since the gate electrode GM and the epitaxial layer EP are adjacent to each other via the insulating film IFM, the dielectric breakdown occurs in the insulating film IFM when a large potential difference of about 5 V is caused between the gate electrode GM and the epitaxial layer EP, and the leakage current flowing between the gate electrode GM and the epitaxial layer EP in the reading operation significantly increases. In the reading operation, the presence or absence of the writing of the information in the memory cell is determined by measuring a magnitude of the leakage current flowing through the insulating film IFM.

In the first embodiment, as illustrated in FIG. 1, the plurality of memory cells arranged in the Y direction share the gate electrodes G1 and GM, and the respective source regions of the selection transistors of the plurality of memory cells arranged in the Y direction are insulated from each other and the contact plug CPS is connected to each of the source regions. Namely, in the plurality of memory cells arranged in the Y direction, it is possible to individually control the source regions of the selection transistors although the gate electrodes GM are commonly controlled. In addition, it is possible to individually control a plurality of the gate electrodes G1 arranged in the X direction, and it is possible to individually control a plurality of the gate electrodes GM arranged in the X direction.

Accordingly, in the write operation and the reading operation, it is possible to select a specific memory cell from the plurality of memory cells arranged in a matrix form by supplying a potential to specific gate electrodes GM and G1 and source region of the selection transistor.

Hereinafter, a semiconductor device of a comparative example will be described, and an effect of the semiconductor device of the first embodiment will be further described.

A semiconductor device which has a memory transistor and a selection transistor on a bulk silicon substrate instead of an SOI substrate is conceivable as a semiconductor device of a comparative example having an anti-fuse element with a configuration different from the above-described configuration. The semiconductor device of the comparative example does not have an epitaxial layer on the bulk silicon substrate, and the source region of the memory transistor and the source and drain regions of the selection transistor are all formed on an upper surface of the bulk silicon substrate. The memory transistor has a gate electrode formed on the bulk silicon substrate via a gate insulating film.

When writing the information in a memory cell of the comparative example having the memory transistor and the selection transistor described above, the gate insulating film right below the gate electrode of the memory transistor is set as a target of the dielectric breakdown. Since the magnitude of the leakage current between the gate electrode and the semiconductor substrate differs between the cases where the dielectric breakdown occurs and does not occur in the gate insulating film, it is possible to read the presence or absence of the writing of the information in accordance with the magnitude of the leakage current.

However, when a high voltage is applied to the gate electrode of the memory transistor in the write operation, a depletion layer appears in the bulk silicon substrate right below the gate electrode, that is, in the channel region, and an electric field is hardly applied to the gate electrode in some cases. In such a case, there occurs a problem that it is difficult to normally perform the write operation in the memory cell and a power consumption of the semiconductor device increases.

As a technique for suppressing the occurrence of the depletion layer described above, it is conceivable that a diffusion region is formed by introducing a high-concentration n-type impurity into the upper surface of the bulk silicon substrate right below the gate electrode, thereby forming a capacitor structure including the diffusion region and the gate electrode. In this manner, it is possible to prevent the depletion in the bulk silicon substrate.

Here, in the SOI element formed on the SOI substrate, in comparison with a semiconductor element formed on the bulk silicon substrate, an effect of reduction in the power consumption, increase in operation speed, improvement in short-channel characteristics and the like can be obtained by forming the semiconductor element on the SOI layer having a small film thickness. Thus, in order to obtain the above-described effects and the like in various semiconductor elements including the selection transistor, it is conceivable to form the anti-fuse element on the SOI substrate together with such semiconductor elements. In the case where the anti-fuse element is formed on the SOI substrate and the gate insulating film of the memory transistor is set as the target of the dielectric breakdown like the above-described comparative example, when the depletion layer appears in the SOI substrate including the SOI layer right below the gate electrode of the memory transistor, there occurs the problem that it is difficult to normally perform the write operation and the power consumption of the semiconductor device is increased as described above.

In order to solve such a problem of the depletion, it is conceivable to provide the capacitor structure by forming the diffusion region right below the gate electrode of the memory transistor as described above. However, since the SOI layer in an upper part of the SOI substrate is an extremely thin film, the SOI layer is amorphized when an impurity is implanted at high concentration into the SOI layer in order to form the diffusion region, and it is thus difficult to provide the capacitor structure.

Meanwhile, in the first embodiment, the insulating film IFM which is the offset spacer of the side wall of the gate electrode GM is set as the target of the dielectric breakdown in the write operation and the capacitor structure including the epitaxial layer EP neighboring the gate electrode GM and the gate electrode GM is provided instead of providing the capacitor structure including the SOI layer SL and the gate electrode GM. Specifically, the capacitor structure is provided by insulating the gate electrode GM and the epitaxial layer EP, in which the diffusion region D1 is formed by introducing the high-concentration n-type impurity, from each other by the insulating film IFM. Accordingly, it is possible to prevent the problem that the electric field is hardly applied to the gate electrode GM due to the depletion on the side of the SOI substrate.

As a result, since it is possible to provide the anti-fuse element on the SOI substrate, the performance of the semiconductor device can be improved. In addition, since it is possible to more reliably perform the dielectric breakdown in the write operation, the reliability of the semiconductor device can be improved. Further, since it is possible to perform the dielectric breakdown with a lower voltage, the power consumption of the semiconductor device can be reduced.

Incidentally, in the semiconductor device according to the first embodiment, there is no problem even when the dielectric breakdown occurs in the gate insulating film GFM instead of in the insulating film IFM during the write operation.

Figure 3:
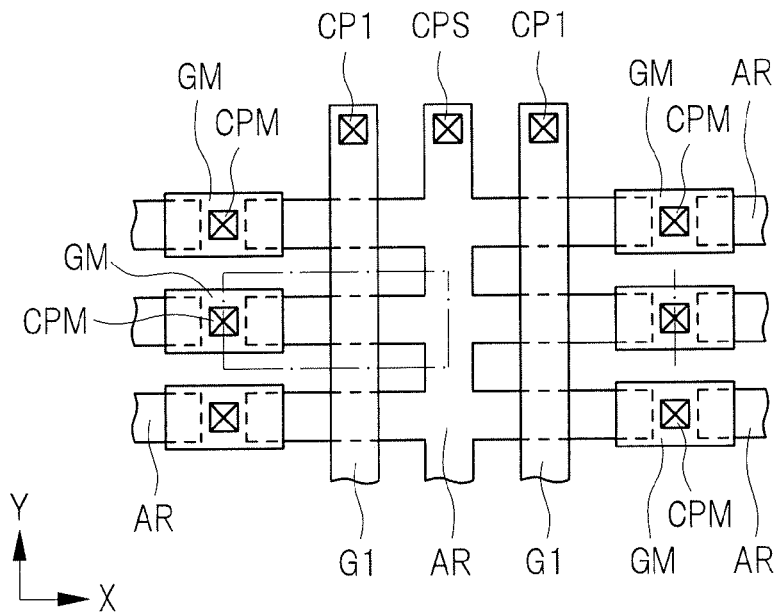
FIG. 3 is a planer layout illustrating a semiconductor device of a modified example of the first embodiment of the present invention.

Hereinafter, a modified example of the semiconductor device according to the first embodiment will be described with reference to FIG. 3. FIG. 3 is a planer layout illustrating the modified example of the semiconductor device according to the first embodiment. In FIG. 3, the region of the unit memory cell in which one-bit information is stored is enclosed by a one-dot chain line.

As illustrated in FIG. 3, the respective source regions of the plurality of selection transistors arranged in the Y direction are connected to each other in a layout of a memory array of the semiconductor device of the modified example unlike the layout illustrated in FIG. 1. Namely, the active region AR is not separated into plural portions in the Y direction. In addition, the gate electrode GM constituting the memory transistor does not extend in the Y direction, and is formed one by one for each of the plurality of memory cells arranged in the Y direction. In other words, the respective gate electrodes GM of a plurality of the memory transistors (anti-fuse elements and memory elements) constituting the plurality of memory cells arranged in the Y direction are formed to be separated from each other, and the plurality of the gate electrodes GM are not electrically connected to each other. Namely, the plurality of memory transistors arranged in the Y direction do not share the gate electrode GM.

The gate electrode GM, the gate electrode G1, the gate electrode G1 and the gate electrode GM are sequentially disposed in this order in the X direction right above the active region AR. The active region AR has a pattern extending in the Y direction between these two gate electrodes G1 extending in the Y direction. In addition, the active region AR has a plurality of patterns extending in the X direction, and the plurality of patterns extending in the X direction are arranged in the Y direction. The plurality of patterns extending in the X direction are integrated with the pattern extending in the Y direction described above.

Specifically, one active region AR is constituted of the plurality of patterns extending in the X direction and the pattern extending in the Y direction. The contact plug CPS is connected to the pattern constituting the active region AR and extending in the Y direction, and it is possible to supply a potential to each of the plurality of patterns arranged in the Y direction and extending in the X direction through the contact plug CPS.

In addition, the pattern constituting the active region AR and extending in the X direction and the pattern constituting another active region AR and extending in the X direction are disposed side by side in the X direction. One gate electrode GM is formed right above these patterns neighboring in the X direction. Namely, one gate electrode GM overlaps apart of each of the two different active regions AR neighboring in the X direction when seen in a plan view. The contact plug CPM is connected to each upper surface of the plurality of gate electrodes GM disposed side by side in the Y direction.

Specifically, the same potential is supplied to the respective source regions of the plurality of selection transistors formed in one active region AR through the contact plug CPS. In addition, the contact plug CPM is connected to each of the plurality of gate electrodes GM arranged in the Y direction. Namely, it is possible to supply different potentials to the plurality of gate electrodes GM arranged in the Y direction, respectively. Accordingly, in the plurality of memory cells arranged in the Y direction, it is possible to individually control the gate electrodes GM although the source regions of the plurality of selection transistors are commonly controlled.

The cross-sectional structure of the unit memory cell enclosed by the one-dot chain line in FIG. 3 is the same as the structure described with reference to FIG. 2. Incidentally, FIG. 2 illustrates the contact plug connected to each of the source region and the gate electrodes G1 and GM of the selection transistor Q1 in order to facilitate understanding of the connection state of each contact plug. However, in the case where a cross-sectional view of the unit memory cell taken along the X direction in the layout illustrated in FIG. 3 is actually illustrated, the contact plugs CP1 and CPS are not illustrated in the cross-sectional view, and the contact plug CPM connected to the gate electrode GM is illustrated.

In this modified example, it is possible to obtain the same effect as that of the semiconductor device described with reference to FIGS. 1 and 2 by providing an anti-fuse element in which the insulating film IFM (see FIG. 2) which is formed between the side wall of the gate electrode GM on the SOI substrate and the epitaxial layer is set as a target of the dielectric breakdown.

(Second Embodiment)

Figure 4:
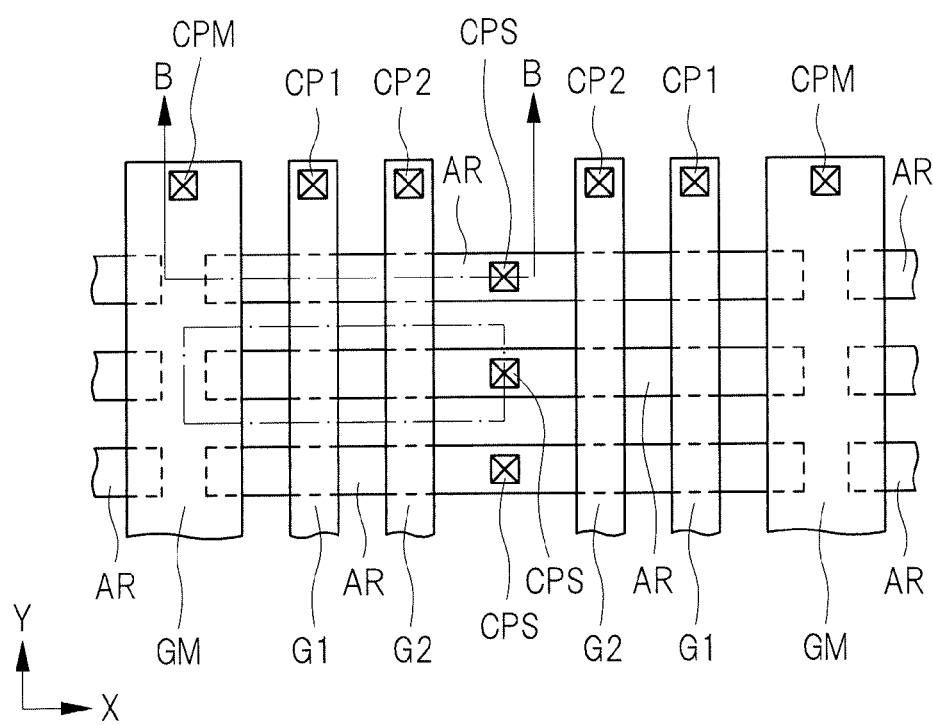
FIG. 4 is a planer layout illustrating a semiconductor device of the second embodiment of the present invention.
Figure 5:
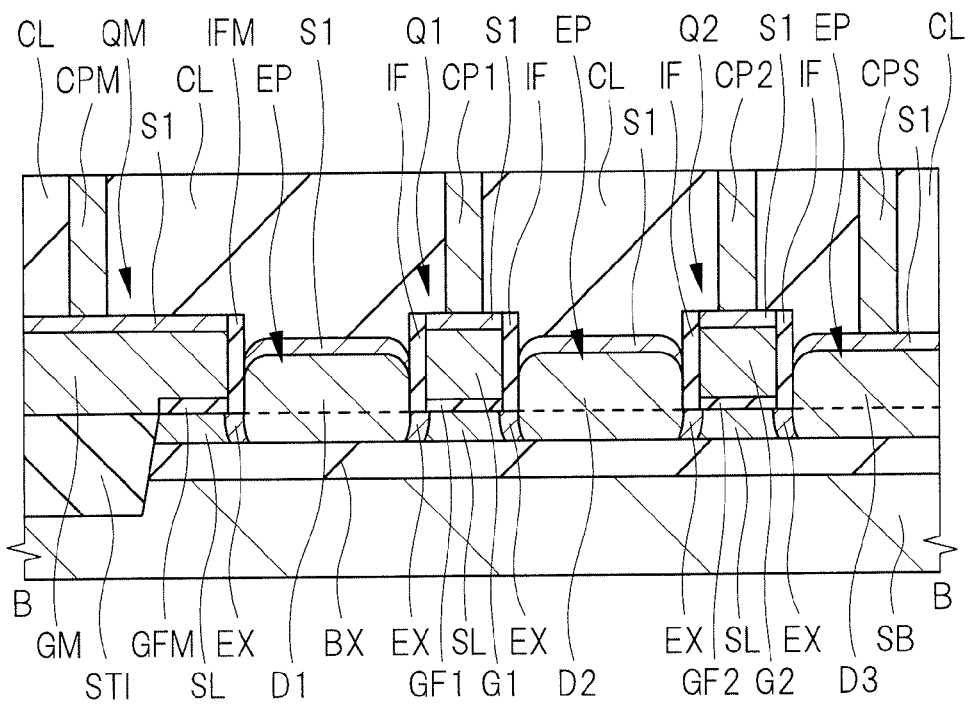
FIG. 5 is a cross-sectional view taken along a line B-B of FIG. 4.

In the second embodiment, the configuration in which two selection transistors are connected in series in the unit memory cell, thereby preventing the deterioration in the performance of the selection transistor due to the high voltage will be described with reference to FIGS. 4 to 6. FIG. 4 is a planer layout illustrating a memory array constituting a semiconductor device of the second embodiment. FIG. 5 is a cross-sectional view taken along a line B-B of FIG. 4. FIG. 6 is a table describing each operation of a semiconductor device of a comparative example and the semiconductor device of the second embodiment. Namely, FIG. 6 is the table illustrating a voltage to be applied to each part of the memory cell before and after the dielectric breakdown in the cases where the number of the selection transistors is one and two.

FIG. 4 illustrates only the active region AR, the gate electrodes G1 and GM, a gate electrode G2, the contact plugs CP1, CPM and CPS and a contact plug CP2, and illustrations of the element isolation region, the offset spacer, the silicide layer, the interlayer insulating film, the wiring and the like are omitted. In addition, in FIG. 4, the outline of the active region AR right below each of the gate electrodes G1 and GM is illustrated by the dashed line. Also, in FIG. 4, the region of the unit memory cell in which one-bit information is stored is enclosed by the one-dot chain line. The unit memory cell has one memory transistor and two selection transistors.

As illustrated in FIG. 4, the layout of the semiconductor device according to the second embodiment is similar to the layout of the semiconductor device according to the first embodiment described above with reference to FIG. 1, but it has a difference in configuration from the first embodiment in the point in which the gate electrode G2 is provided and accordingly the selection transistor is added. The layout illustrated in FIG. 4 is different from the layout illustrated in FIG. 1 in the point in which the gate electrode G2 extending in the Y direction is provided between the contact plug CPS and the gate electrode G1. In addition, the contact plug CP2 is connected to the gate electrode G2.

The gate electrode G2 overlaps the plurality of active regions AR arranged in the Y direction when seen in a plan view like the gate electrode G1. Specifically, the gate electrode GM, the gate electrode G1, the gate electrode G2, the gate electrode G2, the gate electrode G1 and the gate electrode GM sequentially arranged in this order in the X direction are formed right above one active region AR. The contact plug CPS is connected to the active region AR between the above-described two gate electrodes G2. Each of the gate electrodes G1 and G2 has a gate length smaller than that of the gate electrode GM.

The gate electrode G1 and the source and drain regions in the active region AR exposed next to the gate electrode G1 constitute a first selection transistor, and the gate electrode G2 and the source and drain regions in the active region AR exposed next to the gate electrode G2 constitute a second selection transistor. In the unit memory cell, the first selection transistor and the second selection transistor are connected in series. Specifically, the drain region of the second selection transistor is connected to the source region of the first selection transistor. The source region of the selection transistor including the gate electrode G2 is formed in the active region AR at the position to which the contact plug CPS is connected.

The contact plug is not connected to the active region AR between the gate electrode G1 and the gate electrode G2, and the contact plug is not connected to the active region AR between the gate electrode G1 and the gate electrode GM. Namely, in each of the plurality of active regions AR, the contact plug is connected only to the position where the source region of the second selection transistor is formed.

Unlike the cross-sectional structure illustrated in FIG. 2, the two selection transistors are provided next to the memory transistor QM in the cross-sectional structure illustrated in FIG. 5. The selection transistor (first selection transistor) Q1 neighboring the memory transistor QM has the same structure as that of the first embodiment described with reference to FIG. 2. However, the contact plug is not connected to the source region of the selection transistor Q1. A selection transistor (second selection transistor) Q2 having the same structure as the selection transistor Q1 is formed in a region neighboring the selection transistor Q1 and located on an opposite side with respect to the region in which the memory transistor QM is formed. In other words, the selection transistor Q1 is disposed between the selection transistor Q2 and the memory transistor QM. Each of the selection transistors Q1 and Q2 is an n-channel MOSFET.

The selection transistor Q2 has the gate electrode G2 formed on the SOI layer SL via a gate insulating film GF2. Side walls on both sides of the gate electrode G2 are covered with the insulating film IF serving as the offset spacer. The gate insulating film GF2 is made of, for example, a silicon oxide film, the gate electrode G2 is made of, for example, a polysilicon film, and the insulating film IF is made of, for example, a silicon nitride film. The epitaxial layer EP is formed next to the gate electrode G2 via the insulating film IF. The pair of epitaxial layers EP formed on the SOI layer SL is in contact with the side wall of the insulating film IF which is in contact with a side wall of the gate electrode G2. Specifically, one side wall of the insulating film IF is in contact with the gate electrode G2, and the other side wall thereof is in contact with the epitaxial layer EP. Incidentally, a sidewall may be formed next to the gate electrode G2 via the insulating film IF.

Source and drain regions made of an n-type semiconductor region of the selection transistor Q2 are formed in the pair of epitaxial layers EP disposed so as to sandwich the gate electrode G2 and the SOI layer SL below these epitaxial layers EP. Each of the source and drain regions of the selection transistor Q2 has the epitaxial layer EP formed in the SOI layer SL. The drain region of the selection transistor Q2 has the diffusion region D2, and the source region of the selection transistor Q2 has a diffusion region D3.

Specifically, the selection transistors Q1 and Q2 share the diffusion region D2 constituting the source region of the selection transistor Q1 and the drain region of the selection transistor Q2. The gate electrode G1 and the gate electrode G2 are disposed so as to sandwich the epitaxial layer EP including the diffusion region D2. Namely, the memory transistor QM and the selection transistors Q1 and Q2 are sequentially connected in series.

The contact plug CPS is connected to the epitaxial layer EP including the diffusion region D3 constituting the source region of the selection transistor Q2 via the silicide layer S1 in contact with the upper surface of the epitaxial layer EP. The contact plug CP2 is connected to the gate electrode G2 via the silicide layer S1 on the gate electrode G2.

In this embodiment, as illustrated in FIG. 4, the plurality of memory cells arranged in the Y direction share the gate electrodes G1, G2 and GM, the source regions of the selection transistors of the plurality of memory cells arranged in the Y direction are insulated from each other, and the contact plug CPS is connected to each of the source regions. Specifically, in the plurality of memory cells arranged in the Y direction, it is possible to individually control the source regions of the selection transistors although the gate electrodes GM are commonly controlled. In addition, it is possible to individually control the plurality of gate electrodes G1 arranged in the X direction, it is possible to individually control the plurality of gate electrodes G2 arranged in the X direction, and it is possible to individually control the plurality of gate electrodes GM arranged in the X direction.

Accordingly, in the write operation and the reading operation, it is possible to select a specific memory cell from the plurality of memory cells arranged in a matrix form by supplying a potential to the gate electrodes GM, G1 and G2 and the source region of the selection transistor.

Next, a value of the voltage to be applied before and after the write operation to each part of the memory cell without the selection transistor Q2 (see FIG. 5) and the memory cell with the selection transistor Q1 (see FIG. 5) and the selection transistor Q2 like in the second embodiment will be described with reference to the table of FIG. 6. In the table of FIG. 6, the memory cell which has only one selection transistor is indicated as a one-stage selection Tr structure, and the memory cell according to the second embodiment which has the two selection transistors is indicated as a two-stage selection Tr structure.

FIG. 6 illustrates the voltage to be applied to each part right before and right after the dielectric breakdown occurs in the memory transistor QM (see FIG. 5) in the write operation. Specifically, in FIG. 6, a row for the case right before the writing in the one-stage selection Tr structure (before breakdown), a row for the case right after the writing in the one-stage selection Tr structure (right after breakdown), a row for the case right before the writing in the two-stage selection Tr structure (before breakdown) and a row for the case right after the writing in the two-stage selection Tr structure (right after breakdown) are illustrated in this order from the top. The expression "right after breakdown" used here means a point of time in the middle of voltage application for the write operation and right after the dielectric breakdown occurs in the insulating film IFM (see FIG. 5).

In addition, in FIG. 6, columns for the gate electrode GM, the diffusion region D1, the gate electrode G1, the diffusion region D2, the gate electrode G2 and the diffusion region D3 are illustrated in this order from the left. FIG. 6 is the table for describing the voltage to be applied to these parts at the time of the write operation of the memory cell.

With respect to the one-stage selection Tr structure, the gate electrode GM described in FIG. 6 means the gate electrode of the memory transistor, the diffusion region D1 means the source region of the memory transistor and the drain region of the selection transistor, the gate electrode G1 means the gate electrode of the selection transistor, and the diffusion region D2 means the source region of the selection transistor. The one-stage selection Tr structure does not have the gate electrode G2 and the diffusion region D3.

In addition, with respect to the two-stage selection Tr structure, the diffusion region D1 described in FIG. 6 means the source region of the memory transistor QM and the drain region of the selection transistor Q1 illustrated in FIG. 5, the diffusion region D2 described in FIG. 6 means the source region of the selection transistor Q1 and the drain region of the selection transistor Q2 illustrated in FIG. 5, and the diffusion region D3 described in FIG. 6 means the source region of the selection transistor Q2 illustrated in FIG. 5. In addition, with respect to the two-stage selection Tr structure, the gate electrode GM means the gate electrode of the memory transistor QM described in FIG. 5, and the gate electrodes G1 and G2 illustrated in FIG. 6 mean each gate electrode of the selection transistors Q1 and Q2 described in FIG. 5.

As illustrated in FIG. 6, when performing the writing, a voltage of about 5 V is applied to the gate electrode GM in order to cause the dielectric breakdown in the insulating film IFM. In this case, a voltage of, for example, 4.5 V is applied to the gate electrode GM. In the one-stage selection Tr structure before the breakdown, a voltage of 2.0 V is applied to the gate electrode G1 of the selection transistor to set the selection transistor to be in an on-state. In addition, the diffusion region D2 which is the source region of the selection transistor is fixed to the ground potential, that is, 0.0 V. At this time, since the dielectric breakdown has not occurred, a voltage of the gate electrode GM is not applied to the diffusion region D1.

Thereafter, the gate electrode GM and the diffusion region D1 in the one-stage selection Tr structure are electrically conducted to each other right after the dielectric breakdown occurs, and thus, the voltage of 4.5 V which has been applied to the gate electrode GM is applied to the diffusion region D1. Since the selection transistor is in an on-state, the large potential difference is caused between the drain region and the source region, so that current flows between the source region and the drain region of the selection transistor.

Meanwhile, in the two-stage selection Tr structure before the breakdown, a voltage of 3.0 V is applied to the gate electrode G1 of the first selection transistor to set the first selection transistor to be in an on-state, and a voltage of 0.8 V is applied to the gate electrode G2 of the second selection transistor to set the second selection transistor to be in an on-state. In addition, the diffusion region D3 which is the source region of the second selection transistor is fixed to the ground potential, that is, 0.0 V. At this time, since the dielectric breakdown has not occurred, the voltage of the gate electrode GM is not applied to the diffusion region D1. The voltage is not applied to the diffusion region D2, either.

Thereafter, the gate electrode GM and the diffusion region D1 in the two-stage selection Tr structure are electrically conducted to each other right after the dielectric breakdown occurs, and thus, the voltage of 4.5 V which has been applied to the gate electrode GM is applied to the diffusion region D1. Since the first selection transistor and the second selection transistor are in an on-state, the potential difference is caused between the drain region and the source region, so that current flows between the drain region of the first selection transistor and the source region of the second selection transistor. At this time, a potential of the diffusion region D2 is 2.2 V.

The significant difference between the one-stage selection Tr structure and the two-stage selection Tr structure lies in a point that the potential difference between the source region and the drain region of each of the first and second selection transistors is relatively small in the two-stage selection Tr structure while the relatively large potential difference is caused between the source region and the drain region of the selection transistor in the one-stage selection Tr structure.

Hereinafter, an effect of the semiconductor device according to the second embodiment will be described.

In the case where the offset spacer which is in contact with the side wall of the gate electrode of the memory transistor is set as the target of the dielectric breakdown of the anti-fuse element, it is necessary to apply a voltage of about 4 to 5 V to the gate electrode even when the offset spacer has a film thickness of 2 to 3 nm. Accordingly, in the one-stage selection Tr structure which has been described with reference to FIG. 6, a high voltage which has been applied to the gate electrode of the memory transistor is applied to the drain region of the single selection transistor provided in the unit memory cell right after the dielectric breakdown.

As a result, the relatively large potential difference is caused between the source region and the drain region of the selection transistor, so that there is a risk of the deterioration in the performance of the selection transistor. In particular, since the selection transistor formed on the SOI layer with a small film thickness has a low drain withstand voltage as compared with the case of being provided on the bulk silicon substrate, it has low resistance with respect to the high voltage. Thus, in the case where there is only one selection transistor to constitute the unit memory cell, a voltage required for the dielectric breakdown is applied to the selection transistor, and the characteristics of the selection transistor deteriorate, so that there occurs a problem that the selection transistor does not normally operate in the reading operation.

Specifically, in the one-stage selection Tr structure right after the dielectric breakdown in FIG. 6, the voltage of 4.5 V which has been applied to the gate electrode GM of the memory transistor is applied to the drain region (diffusion region D1) of the selection transistor, so that the large potential difference is caused between the drain and the source of the selection transistor. Thus, there is the risk of the deterioration in the characteristics of the selection transistor formed on the SOI substrate and having the low withstand voltage.

Accordingly, in the second embodiment, in order to alleviate a drain voltage applied to the selection transistor, the selection transistor is additionally provided and the two selection transistors are connected in series. As illustrated in FIG. 6, the voltage of 4.5 V is applied to the diffusion region D1 which is the drain region of the first selection transistor Q1 (see FIG. 5) right after the dielectric breakdown occurs in the two-stage selection Tr structure, but since the potential of the diffusion region D2 is 2.2 V, the potential difference between the source region and the drain region of the first selection transistor Q1 is about 2.3 V. In addition, since the potential of the diffusion region D2 is 2.2 V and the potential of the diffusion region D3 is 0.0 V, the potential difference between the source region and the drain region of the second selection transistor Q2 (see FIG. 5) is about 2.2 V.

Specifically, in the second embodiment, the voltage of 4.5 V which has been applied for the dielectric breakdown is divided into the potential difference of 2.3 V in the selection transistor Q1 and the potential difference of 2.2 V in the selection transistor Q2 by employing the two-stage selection Tr structure. In this manner, it is possible to prevent the generation of the relatively large potential difference in each of the first selection transistor Q1 and the second selection transistor Q2. Accordingly, since it is possible to prevent the deterioration in the performance of each selection transistor, it is possible to prevent the deterioration in the performance of the selection transistor even when the memory cell including the anti-fuse element is provided on the SOI substrate. Accordingly, it is possible to improve the performance of the semiconductor device.

In addition, the semiconductor device according to the second embodiment can obtain the same effect as in the above-described first embodiment.

Figure 7:
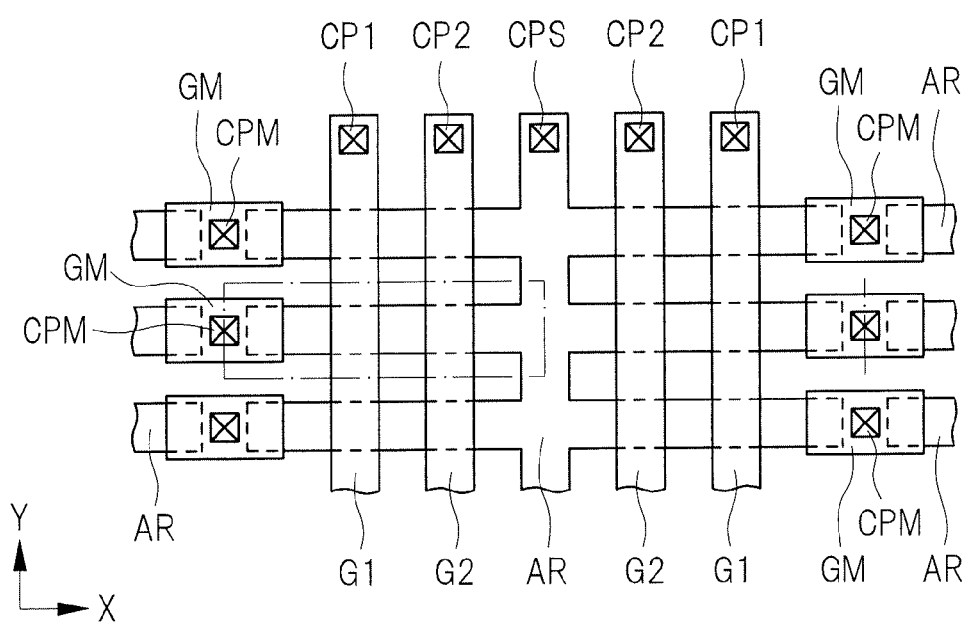
FIG. 7 is a planer layout illustrating a semiconductor device of a modified example of the second embodiment of the present invention.

Hereinafter, a modified example of the semiconductor device according to the second embodiment will be described with reference to FIG. 7. FIG. 7 is a planer layout illustrating the modified example of the semiconductor device according to the second embodiment. In FIG. 7, the region of the unit memory cell in which one-bit information is stored is enclosed by the one-dot chain line.

As illustrated in FIG. 7, the respective source regions of a plurality of the second selection transistors arranged in the Y direction are connected to each other in a layout of a memory array of the semiconductor device of this modified example unlike the layout illustrated in FIG. 4. Specifically, the active region AR is not separated into plural portions in the Y direction. In addition, the gate electrode GM constituting the memory transistor does not extend in the Y direction, and is formed one by one for each of the plurality of memory cells arranged in the Y direction.

Namely, the plurality of memory transistors arranged in the Y direction do not share the gate electrode GM.

The gate electrode GM, the gate electrode G1, the gate electrode G2, the gate electrode G2, the gate electrode G1 and the gate electrode GM are sequentially disposed in this order in the X direction right above the active region AR. The active region AR has a pattern extending in the Y direction between these two gate electrodes G2 extending in the Y direction. In addition, the active region AR has a plurality of patterns extending in the X direction, and the patterns extending in the X direction are arranged in the Y direction. The plurality of patterns extending in the X direction are integrated with the pattern extending in the Y direction described above.

Specifically, one active region AR is constituted of the plurality of patterns extending in the X direction and the pattern extending in the Y direction. The contact plug CPS is connected to the pattern constituting the active region AR and extending in the Y direction, and it is possible to supply a potential through the contact plug CPS to each of the plurality of patterns arranged in the Y direction and extending in the X direction. The gate electrode G1 constitutes the first selection transistor, and the gate electrode G2 constitutes the second selection transistor.

In addition, the pattern constituting the active region AR and extending in the X direction and the pattern constituting another active region AR and extending in the X direction are disposed side by side in the X direction. One gate electrode GM is formed right above these patterns neighboring in the X direction. Specifically, one gate electrode GM overlaps a part of each of the two different active regions AR neighboring in the X direction when seen in a plan view. The contact plug CPM is connected to the upper surface of each of the plurality of gate electrodes GM disposed side by side in the Y direction.

Specifically, the same potential is supplied to the respective source regions of a plurality of the second selection transistors formed in one active region AR through the contact plug CPS. In addition, the contact plug CPM is connected to each of the plurality of gate electrodes GM arranged in the Y direction. Specifically, it is possible to supply different potentials to the plurality of gate electrodes GM arranged in the Y direction, respectively. Therefore, in the plurality of memory cells arranged in the Y direction, it is possible to individually control the gate electrodes GM although the respective source regions of the plurality of selection transistors are commonly controlled. The contact plug CP1 is connected to the gate electrode G1, and the contact plug CP2 is connected to the gate electrode G2.

The cross-sectional structure of the unit memory cell enclosed by the one-dot chain line in FIG. 7 is the same as the structure described with reference to FIG. 5. Incidentally, FIG. 5 illustrates the contact plug connected to each of the source region and the gate electrodes G1, G2 and GM of the selection transistor Q2 in order to facilitate understanding of the connection state of each contact plug. However, in the case where a cross-sectional view of the unit memory cell taken along the X direction in the layout illustrated in FIG. 7 is actually illustrated, the contact plugs CP1, CP2 and CPS are not illustrated in the cross-sectional view, and the contact plug CPM connected to the gate electrode GM is illustrated.

In this modified example, it is possible to obtain the same effect as that of the semiconductor device described with reference to FIGS. 4 to 6 by providing an anti-fuse element in which the insulating film IFM (see FIG. 5) which is formed between the side wall of the gate electrode GM on the SOI substrate and the epitaxial layer is set as a target of the dielectric breakdown.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
   an SOI substrate including a semiconductor substrate, a first insulating film foamed on the semiconductor substrate and a first semiconductor layer foamed on the first insulating film;
   a first gate electrode foamed on the first semiconductor layer via a second insulating film;
   a second semiconductor layer and a third semiconductor layer foamed on the first semiconductor layer so as to sandwich the first gate electrode; and
   a second gate electrode foamed on the first semiconductor layer via a third insulating film,
   wherein the first semiconductor layer has a first conductivity type, and the second semiconductor layer and the third semiconductor layer have a second conductivity type different from the first conductivity type,
   the second semiconductor layer and the third semiconductor layer constitute source and drain regions of a first field effect transistor including the first gate electrode,
   a fourth insulating film is foamed over a side wall of the second gate electrode and is located between the second semiconductor layer and the second gate electrode,
   the second gate electrode and the fourth insulating film constitute a memory element, and the memory element pertains writing of information by causing dielectric breakdown in the fourth insulating film.

2. The semiconductor device according to claim 1, wherein an impurity concentration of the second semiconductor layer is higher than an impurity concentration of the first semiconductor layer right below the second gate electrode.

3. The semiconductor device according to claim 1, further comprising:
   a third gate electrode foamed on the first semiconductor layer via a fifth insulating film,
   wherein the third semiconductor layer constitutes a drain region of a second field effect transistor including the third gate electrode.

4. The semiconductor device according to claim 1,
   wherein the memory element and the first field effect transistor constitute a unit memory cell,
   a plurality of the unit memory cells are disposed side by side along an upper surface of the SOI substrate,
   a plurality of the memory elements constituting the plurality of unit memory cells share a common second gate electrode with each other, and
   respective source regions of a plurality of the first field effect transistors constituting the plurality of unit memory cells are separated from each other.

5. The semiconductor device according to claim 1,
   wherein the memory element and the first field effect transistor constitute a unit memory cell,
   a plurality of the unit memory cells are disposed side by side along an upper surface of the SOI substrate,
   respective second gate electrodes of a plurality of the memory elements constituting the plurality of unit memory cells are separated from each other, and
   a plurality of the first field effect transistors constituting the plurality of unit memory cells share a common source region with each other.

6. The semiconductor device according to claim 1, wherein a plug is not connected to the second semiconductor layer.

7. The semiconductor device according to claim 1, wherein the fourth insulating film is in contact with the side wall of the second gate electrode and located between the second semiconductor layer and the second gate electrode.

8. The semiconductor device according to claim 1,
   wherein plugs are respectively connected to the first gate electrode, the second gate electrode, and the third semiconductor layer, and
   a plug is not connected to the second semiconductor layer.

9. The semiconductor device according to claim 1, further comprising a fifth insulating film foamed over a side wall of the first gate electrode,
   wherein the second semiconductor layer is between and in contact with the fourth insulating film and the fifth insulating film.

10. The semiconductor device according to claim 1,
    wherein a first portion of the first semiconductor layer is in contact with the second semiconductor layer,
    wherein a second portion of the first semiconductor layer is in contact with the third semiconductor layer,
    wherein the first and second portions have the first conductivity type different from the second conductivity type.

11. The semiconductor device according to claim 1, wherein the memory element is constructed as an anti-fuse memory element.

12. The semiconductor device according to claim 1,
wherein a trench filled with an insulating film extends through the SOI substrate from the first semiconductor layer to an intermediate region within the semiconductor substrate, and
wherein at least a portion of the second gate electrode is formed on the insulating film in the trench.

13. The semiconductor device according to claim 3,
wherein a voltage higher than a voltage applied to the third gate electrode is applied to the first gate electrode in performing the writing of information.

14. The semiconductor device according to claim 6, wherein a silicide layer is foamed on the second semiconductor layer.

15. A semiconductor device comprising:
a semiconductor substrate;
a buried insulating film on the semiconductor substrate;
a first semiconductor layer on the buried insulating film;
gate insulating film portions foamed over the first semiconductor layer;
first and second gate electrodes foamed over respective gate insulating film portions;
second and third semiconductor layers foamed on the first semiconductor layer, the second semiconductor layer being between the first and second gate electrodes in plan view, the third semiconductor layer being on an opposite side of the first gate electrode from the second semiconductor layer in plan view; and
a sidewall insulating film disposed between a sidewall of the second gate electrode and a sidewall of the second semiconductor layer,
wherein the second gate electrode and the sidewall insulating film constitute an anti-fuse memory element that writes information via dielectric breakdown in the sidewall insulating film.

16. The semiconductor device according to claim 15,
wherein, in an operation to read the information written by the anti-fuse memory element, current flows between the second gate electrode and the second semiconductor layer via the sidewall insulating film.

17. The semiconductor device according to claim 15, wherein the sidewall insulating film is in contact with both the second gate electrode and the second semiconductor layer.

* * * * *